May 16, 1961 R. T. RACE 2,984,774

TRANSISTOR HEAT SINK ASSEMBLY

Filed Oct. 1, 1956

INVENTOR.
Richard T. Race,
BY
Mueller & Aichele
Att'ys.

United States Patent Office 2,984,774

Patented May 16, 1961

2,984,774

TRANSISTOR HEAT SINK ASSEMBLY

Richard T. Race, Chicago, Ill., assignor to Motorola, Inc., Chicago, Ill., a corporation of Illinois Filed Oct. 1, 1956, Ser. No. 613,217

3 Claims. (Cl. 317—234)

This invention relates to heat sinks for dissipating heat from semiconductor devices, and more particularly to heat sinks for power transistors used in electronic equipment such as radio receivers.

In the use of a power semiconductor device, such as a power transistor, heat dissipation is a substantial problem inasmuch as the device produces substantial heat and the characteristics of the device vary undesirably with excessive rise in operating temperature. In the case of a power transistor, most of the heat is produced at the collector junction and consequently most of the heat to be removed is at the collector electrode. This problem is of especial importance where the transistor is used to produce high currents as in the audio output of mobile radio equipment where large audio volume is required because of the high noise level. In such uses of transistors, it is highly desirable to mount the transistor exteriorly of the equipment so that better radiation of heat is provided by the housing of the transistor as well as by the heat sink therefor. However, such exterior mounting exposes the transistors to possible mechanical damage. Accordingly, it is desired that the heat-dissipating structure for such a device also serve to protect the transistors mechanically.

An object of the invention is to provide a new and improved heat sink for a semiconductor device.

Another object of the invention is to provide an effective and inexpensive heat radiating structure for the power transistor of an automobile radio.

A further object is to provide an effective heat-dissipating structure for a semiconductor device which also protects the device mechanically.

A feature of the invention is the provision of an extruded thermally conductive metal heat radiator having a smooth surface on which the mounting base of a power transistor may be supported in good electrical and thermal contact with the surface.

A further feature of the invention is the provision of a heat sink for a semiconductor device including a base portion on which the device is mounted and having radiating fins extending therefrom which extend from the base portion a greater distance than the device to protect the device from mechanical contact.

Another feature of the invention is the provision of an electronic unit utilizing a power transistor having a grounded collector electrode and including a heat sink or radiator for the power transistor mounted on the housing of the unit, with the collector electrode of the transistor mounted on a pedestal on the mounting base thereof which is in turn mounted on the heat sink in electrical and thermal contact therewith so that very effective cooling of the collector electrode is provided.

Still another feature of the invention is the provision of a finned heat sink for a high power semiconductor device having lateral ribs on the fins to increase the effective heat radiating area.

Referring now to the drawings.

Figures 1, 2, 3, 4:
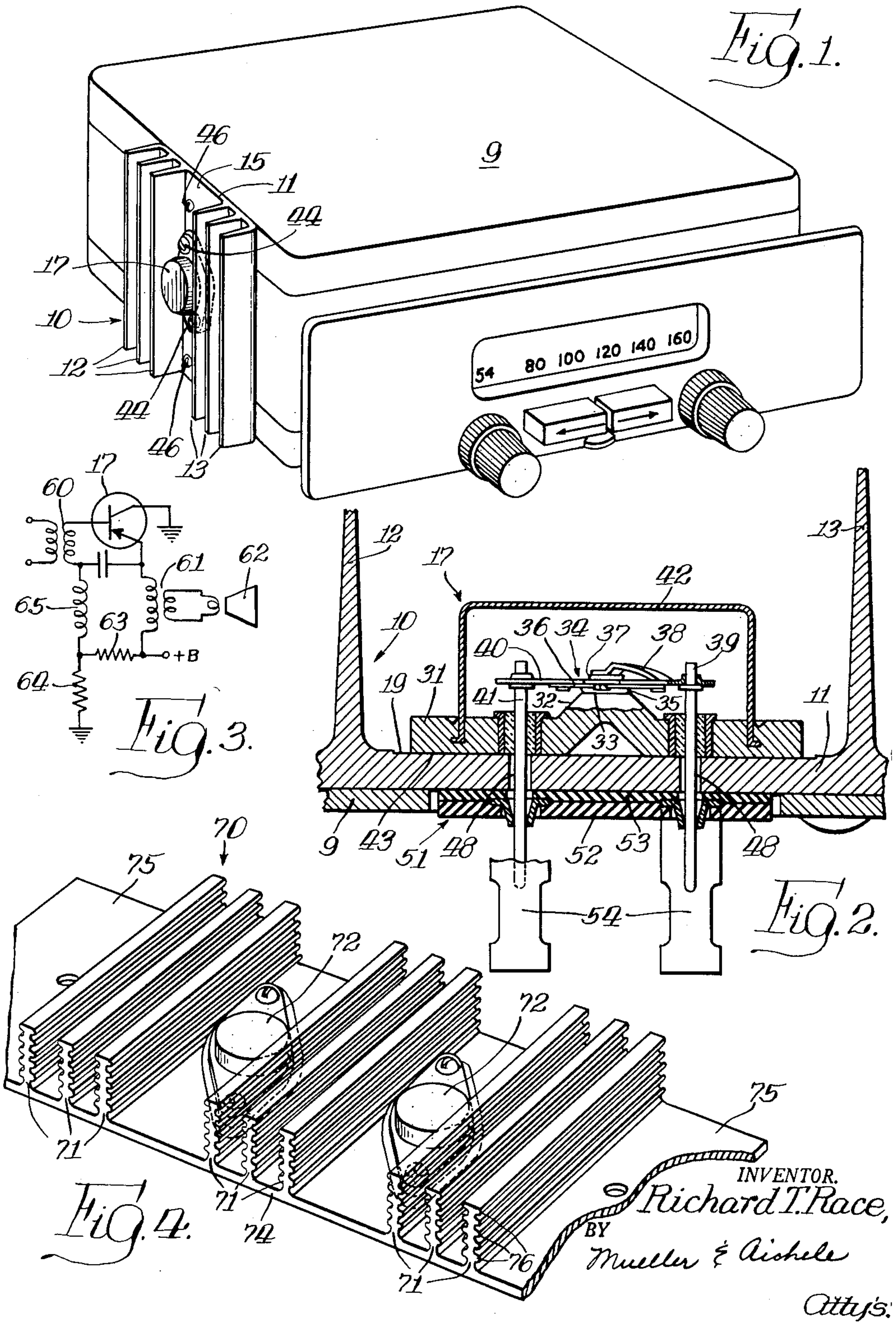
Fig. 1 is a perspective view of an automobile radio receiver utilizing a semiconductor assembly with a heat sink forming one embodiment of the invention.
Fig. 2 is an enlarged vertical section of a portion of the semiconductor assembly shown in Fig. 1 turned 90° from the position thereof in Fig. 1.
Fig. 3 illustrates the connection of the transistor in a radio circuit.
Fig. 4 shows a semiconductor assembly with a heat sink forming an alternate embodiment of the invention.

The invention provides a heat sink of extruded metal of high heat conductivity and including a base having fins projecting laterally therefrom. The heat sink is designed to be mounted on the housing of a radio receiver for use in mobile equipment such as an auto, truck, or the like. The heat sink has a space between the fins provided with a smooth surface on which the mounting base of a power semi-conductor device, such as a power transistor, is mounted in face-to-face contact therewith. The fins of the sink provide a nest for the transistor so that the transistor is protected mechanically. The transistor has a die assembly including a collector electrode enclosed in a header formed by the mounting base and a cup-shaped cover, and this electrode is mounted in thermal contact with a pedestal formed on the mounting base. The heat sink is mounted on the outside of the radio housing so that very excellent heat dissipation occurs from the heat sink and also from the transistor cover and mounting base. Accordingly, the collector junction is kept at a temperature which does not rise to a great extent above the ambient temperature. The radio receiver may include a circuit in which the collector electrode is at ground potential, and the collector electrode is in electrical contact with the mounting base and the mounting base forms an electrical path to ground through the heat sink which is grounded to the housing of the radio receiver. For equipment using two transistors such as in a push-pull power output stage, the heat sink may be provided with two wide channels in which transistors may be mounted separated by fins.

There is shown in Fig. 1 a radio receiver having a housing 9 on which a heat sink 10 is mounted. The heat sink 10 includes a base portion 11 from which groups of fins 12 and 13 project. A space is provided between the fins forming a channel or open portion 15 in which a power transistor 17 is mounted in face-to-face contact. The channel has a smooth mounting surface 19 which may be machined or ground on which the transistor is supported. The heat sink 10 may be formed by extrusion or the like and may be of aluminum or other good heat conductive and electroconductive material.

As shown in Fig. 2, the transistor 17 has a thick mounting base 31 of copper covered with a silver layer plated thereon, which, in turn, is covered by a thin gold layer plated thereover. The gold layer prevents oxidation and corrosion and facilitates soldering the base to other portions of the transistor. The base 31 has a pedestal 32 having a flat top 33 on which a die assembly 34 is positioned. A collector electrode 35 of indium or other suitable metal is fused to the top 33 of the pedestal to form an electrical connection and also a heat connection thereto. The face of the electrode 35 is in contact with the pedestal 33 over the entire pedestal top 33 so that excellent thermal and electrical conductivity between the collector electrode 35 and the pedestal 32 is provided. The collector electrode 35 also is quite thin so that the top 33 of the pedestal is quite close to the collector junction formed between the electrode 35 and a semiconductor wafer 36. The wafer is composed of semi-conductor material such as germanium. An emitter electrode 37 and a base electrode 40 make connection with the wafer 36 to form with the collector electrode 35 a die assembly. The emitter electrode is connected by an emitter lead 38 to a feedthru 39 and the base electrode 40 is connected electrically to a feedthru 41.

A cover 42 formed of copper covered with silver and gold platings applied successively is joined by swaging or the like to the mounting base 31. The mounting base 31 is provided with a smooth flat bottom surface 43 which is planar and fits in face-to-face contact with the polished surface 19 of the heat sink 10 so that excellent thermal and electrical conductivity is achieved between the mounting base 31 and the heat sink 10. Screws 44 secure the transistor 17 securely to the heat sink 10, which is in turn fastened to the chassis 29 by screws 46 (Fig. 1). Accordingly, the heat sink is in excellent thermal and electrical contact with the metal chassis of the radio. The feedthrus 39 and 41 are insulated from the mounting base 31 of the transistor and project through enlarged holes 48 formed in the heat sink 10. A clip 51 including first and second insulating sheets 52 and 53 is provided about the feed thrus 39 and 41. Terminal portions 54 connected to the feedthrus extend into the interior of the housing 9 of the radio receiver for electrical connection to other components thereof.

The heat generated at the junction between the collector electrode 35 and the wafer 36 is transmitted through the indium electrode 35 to the pedestal 32. The heat travels through the pedestal to the base 11 and thence to the sink 10 and the cover 42. All the fins 12 and 13 and the heavy base portion 11 and the cover 42 radiate heat into the surrounding air. Also, the housing and chassis of the radio receive heat from the sink by conduction, and the combined structure keeps the collector junction within less than 3° C. of the ambient temperature of the air surrounding the radiator 10, per watt of collector dissipation in the transistor. Thus, the ambient temperature is sufficient to cool the collector electrode to keep it from inoperable and damaging temperatures without cumbersome and expensive water cooling and the like. The heat sink makes possible an automobile radio receiver of a hybrid type having a transistor output circuit providing high power and operable directly from an automobile battery-generator power supply without voltage step-up for any of the stages of the receiver.

The height of the fins 12 and 13 should be substantially greater than the height of the transistor 17, and preferably is at least twice the height of the transistor. The width of the channel 15 is just slightly greater than the width of the transistor mounting base so that a close-fitting nest is provided for the transistor. In one successful example the sink was approximately 3″ square, the height of the fins 12 and 13 was 0.74″, the thickness of the fins was 0.06″, the thickness of the base 11 was 0.12″, and the width of the channel 15 was 1.2″. Power transistor 17 used had a width of 1.12″ and an overall height of about 0.535″ and the thickness of the base 31 was 0.125″.

The groups of fins 12 and 13 form a nest or socket therebetween for the transistor 17 and project beyond the cover of the transistor to protect the transistor from blows or striking which sometimes would otherwise occur in the handling of the radio set before and during installation, and also protect the transistors during use of the radio set after installation. This feature is important wherever the transistor is mounted on the exterior of the chassis, which is particularly needed for dissipating heat from the high power transistors required for automobile radio receivers.

In the embodiment described above, the transistor collector electrode has been connected electrically to the mounting base of the transistor which is grounded by contact through the heat sink to the housing of the radio receiver. Fig. 3 shows the output circuit for a radio receiver in which a transistor with a grounded collector electrode is used. In this circuit audio signals are applied to transformer 60, which in turn applies the signals to the base and emitter electrodes of the transistor 17. The collector electrode is grounded and the output is derived from the emitter electrode and applied through transformer 61 to the loudspeaker 62. Bias is applied to the emitter and base electrodes by resistors 63 and 64, choke 65, and the transformer 61.

In Fig. 4 there is shown a transistor assembly in accordance with another embodiment of the invention. The heat sink 70 is generally similar to that of Fig. 1 but is shown somewhat enlarged. The fins 71 are spaced to provide two channels for mounting two transistors 72 as is required when a push-pull output is used. The base plate 74 of the heat sink has extensions 75 at the ends for mounting the same on the equipment on which it is used, and these also radiate heat. The fins have laterally projecting ribs or sub-fins 76 which have rounded edges. The sub-fins increase the heat radiating area of the main fins to better dissipate heat from the transistor.

In the event that it is desired to keep the collector electrode of the transistor at a potential other than ground, the transistor may be mounted on a thin insulating layer, or, the surface 19 of the aluminum heat sink may be anodized to form electrical insulation without substantially reducing heat conductivity.

The heat sink described herein above serves to very effectively prevent overheating of the collector junction of a transistor and cools the junction to the maximum extent to hold the same at temperatures not materially over 90° C. The thermal factor generally designated "K" for the heat sinks is less than 3° C., difference in temperature between the collector junction and the ambient temperature surrounding the heat sink per watt of power generated at the collector junction. For a transistor operating class A and providing 3 watts of audio output the collector dissipation would be approximately 6.5 watts. If a transistor operating under these conditions was subjected to an ambient temperature of 60° C. (such as in a closed automobile in a hot climate) the temperature of the collector junction would be only about 80° C. This provides an adequate margin. The heat sinks described above have been illustrated for use with power transistors, but would work equally well to cool other semiconductor devices such as diodes.

I claim:

1. In a semiconductor assembly, a semiconductor device having a mounting base and a cover with a semiconductor unit therein, said semiconductor unit having an electrode mounted in thermal contact with said mounting base, said mounting base having a substantially greater thickness than said cover and forming the primary means for conducting heat from said semiconductor unit, said device having terminals extending from said mounting base, and a heat sink formed of heat conducting material having a flat base portion provided with an exposed side having thereon a smooth face on which said mounting base of said semiconductor device is detachably secured in face-to-face relationship, said base portion having openings therein through which said terminals extend to a side of said base portion opposite said exposed side with said openings being larger than said terminals and providing insulating clearances thereabout, said heat sink having a plurality of parallel integral fins projecting from said exposed side of said base portion on opposite sides of said semiconductor device for radiating heat generated by said semiconductor device and transferred thereto through said mounting base thereof, said fins extending beyond said cover of said device for protecting the same.

2. In a semiconductor assembly, a power transistor device having a flat mounting base and a cover, said mounting base forming the primary means for conducting heat from said device, said transistor device having terminals extending through said mounting base, and a heat sink including a flat base portion having an exposed side on which said mounting base of said device is secured, said base portion having openings larger than said terminals for receiving said terminals with clearance thereabout for electrically insulating the same from said heat sink, said heat sink having parallel heat-dissipating portions rising from said exposed side of said base portion about said transistor device and projecting beyond said cover to mechanically protect said device.

3. In a semiconductor assembly, a power transistor having a flat mounting base and a cover with a semiconductor die assembly therein having a collector electrode mounted in thermal contact with said mounting base, said mounting base having substantial mass and serving to conduct heat from said collector electrode of said semiconductor die assembly, and a heat sink having a base portion provided with an exposed side having thereon a smooth flat face, means mounting said transistor on said heat sink with said mounting base in thermal contact with said flat face of said base portion thereof, said heat sink also having groups of parallel integral fins projecting from said exposed side of said base portion on opposite sides of said transistor for radiating heat generated by said transistor, said fins extending beyond said cover of said power transistor and providing mechanical protection therefor.

References Cited in the file of this patent

UNITED STATES PATENTS

| | | |
|---|---|---|
| 2,725,505 | Webster et al. | Nov. 29, 1955 |
| 2,756,374 | Colleran et al. | July 24, 1956 |
| 2,759,133 | Mueller | Aug. 14, 1956 |
| 2,763,822 | Frola et al. | Sept. 18, 1956 |
| 2,810,849 | Agule | Oct. 22, 1957 |
| 2,887,628 | Zierdt | May 19, 1959 |
| 2,932,684 | Hales et al. | April 12, 1960 |

OTHER REFERENCES

Chow and Suran: "Transient Analysis of Transistor Amplifiers," pg. 191, Electronics, November 1953.

Roka et al.: IRE paper (IRE Proceedings), August 1954, pgs. 1247–1250.

Freedman et al.: IRE (IRE Proceedings), June 1955, pgs. 671–678.